United States Patent
Nam et al.

(10) Patent No.: US 7,978,002 B2
(45) Date of Patent: Jul. 12, 2011

(54) VOLTAGE BOOSTING CIRCUIT AND SEMICONDUCTOR DEVICE

(75) Inventors: Jeong Sik Nam, Seoul (KR); Hi Choon Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 12/610,601

(22) Filed: Nov. 2, 2009

(65) Prior Publication Data

US 2010/0109760 A1 May 6, 2010

(30) Foreign Application Priority Data

Nov. 4, 2008 (KR) .................. 10-2008-0108718

(51) Int. Cl.
*G05F 1/10* (2006.01)
(52) U.S. Cl. ...................................... 327/536
(58) Field of Classification Search .................. 327/535, 327/536, 537
See application file for complete search history.

(56) References Cited

U.S. PATENT DOCUMENTS

| | | | | |
|---|---|---|---|---|
| 5,701,096 A * | 12/1997 | Higashiho | ............. | 327/536 |
| 6,137,343 A * | 10/2000 | Matano | ............. | 327/535 |
| 6,316,985 B1 * | 11/2001 | Kobayashi et al. | ............. | 327/536 |
| 6,480,057 B2 * | 11/2002 | Ogura | ............. | 327/536 |
| 6,714,065 B2 * | 3/2004 | Komiya et al. | ............. | 327/537 |
| 6,850,110 B2 * | 2/2005 | Jang | ............. | 327/536 |
| 6,954,386 B2 * | 10/2005 | Narui et al. | ............. | 365/189.11 |
| 6,992,905 B2 | 1/2006 | Jung | | |
| 7,113,021 B2 * | 9/2006 | Riedel et al. | ............. | 327/536 |
| 7,280,422 B2 | 10/2007 | Kim et al. | | |

FOREIGN PATENT DOCUMENTS

| | | |
|---|---|---|
| JP | 11328959 A | 11/1999 |
| KR | 1020050044086 A | 5/2005 |
| KR | 1020050101893 A | 10/2005 |

* cited by examiner

*Primary Examiner* — Jeffrey S Zweizig
(74) *Attorney, Agent, or Firm* — Volentine & Whitt, PLLC

(57) ABSTRACT

A voltage boosting circuit includes a first voltage boosting circuit configured to receive an external power supply voltage, and pump the external power supply voltage to a second boosting voltage higher than the external supply voltage in a single pumping stage, and a second voltage boosting circuit configured to receive the second boosting voltage and pump the second boosting voltage to a first boosting voltage higher than the second boosting voltage in two pumping stages.

8 Claims, 5 Drawing Sheets

VOLTAGE BOOSTING CIRCUIT AND SEMICONDUCTOR DEVICE

CROSS-REFERENCE TO RELATED APPLICATIONS

This application claims the benefit of Korean Patent Application No. 10-2008-0108718 filed on Nov. 4, 2008, the subject matter of which is hereby incorporated by reference.

BACKGROUND

Embodiments of the present inventive concept relate to semiconductor devices. More particularly, the inventive concept relates to a semiconductor device incorporating a voltage boosting circuit generating a lower voltage as a power supply circuit applied to the voltage boosting circuit generates a higher voltage.

Certain voltages used to drive circuitry within a memory device, (e.g., a voltage applied to a word line during some operations) may need to be higher than the power supply voltage externally provided to the memory device. Thus, memory devices commonly include so-called high voltage generating circuits that receive the external power supply voltage and generate a high voltage. The term "high voltage" in this context means a voltage greater than the power supply voltage. Various pumping circuits are conventionally used within high voltage generating circuits to generate the high voltage.

Recent evolutions in the design of memory systems require reduced overall voltage levels in order to conserve power and enable the operation of densely integrated circuits. As a result, the level of power supply voltages provided to constituent memory devices has been generally reduced. Accordingly, it has become increasingly difficult to internally generate a high voltage within memory devices. In addition, as the level of provided power supply voltages has dropped, the pumping efficiency of pumping circuits used to generate the high voltage has also dramatically dropped.

Up to now, generating a high voltage from a provided power supply voltage having a relatively low level required a voltage boosting circuit having multiple stages (e.g., at least three (3) boosting stages). The use of multiple boosting stages results in longer voltage boosting times. In addition, conventional voltage boosting circuits have increased the size of pumping capacitors. This increased capacitor size has considerable disadvantages given contemporary demands for smaller chip size.

SUMMARY

Embodiments of the inventive concept provide a voltage boosting circuit capable of reducing both constituent capacitor size and voltage boosting time (e.g., pumping cycle time). Embodiments of the inventive concept also provide semiconductor devices incorporating this type of voltage boosting circuit.

In one embodiment, the inventive concept provides a voltage boosting circuit consisting of: a first voltage boosting circuit configured to receive an external power supply voltage, and pump the external power supply voltage to a second boosting voltage higher than the external supply voltage in a single pumping stage; and a second voltage boosting circuit configured to receive the second boosting voltage and pump the second boosting voltage to a first boosting voltage higher than the second boosting voltage in two pumping stages.

In another embodiment, the inventive concept provides a semiconductor device comprising a voltage boosting circuit. The voltage boosting circuit consisting of; a first voltage boosting circuit configured to receive an external power supply voltage, and pump the external power supply voltage to a second boosting voltage higher than the external supply voltage in a single pumping stage, and a second voltage boosting circuit configured to receive the second boosting voltage and pump the second boosting voltage In a related aspect to the foregoing, the first voltage boosting circuit may comprise; a pre-charge circuit configured to charge a precharge voltage node with the external power supply voltage in response to a pre-charge signal, a pumping circuit configured to pump a voltage apparent at the precharge voltage node to the second boosting voltage in response to a pumping enable signal, and a switching circuit configured to provide the second boosting voltage in response to a switching signal.

In another related aspect to the foregoing, the second voltage boosting may comprise; a pre-charge circuit configured to charge voltages apparent at a first node and a second node to the second boosting voltage in response to a pre-charge signal, a first pumping circuit configured to pump the voltage apparent at the first node to an intermediate voltage higher than the second boosting voltage and lower than the first boosting voltage in response to a first pumping enable signal, a first switching circuit configured to connect the first node and the second node in response to a first switching signal, a second pumping circuit configured to pump the voltage apparent at the second node to the first boosting voltage in response to a second pumping enable signal, and a second switching circuit configured to output the first boosting voltage in response to a second switching signal.

DETAILED DESCRIPTION OF THE EMBODIMENTS

Embodiments of the inventive concept will now be described with reference to the accompanying drawings. However, it should be noted that the inventive concept may be variously embodied and is not limited to only the illustrated embodiments. Rather, the illustrated embodiments are presented as teaching examples. Throughout the written description and drawings, like reference numbers and labels are used to indicate like or similar elements.

As noted above, many memory devices include one or more voltage boosting circuits. When an N-channel Metal Oxide Semiconductor (NMOS) transistor is used as an access transistor in a memory cell, an associated voltage boosting circuit may be used to prevent a threshold voltage drop in the transmission performance of data communicated through the NMOS transistor. A boosting voltage for a voltage boosting circuit will be referred to hereafter as "Vpp".

As a driving voltage for a memory device is reduced, an additional voltage boosting source may be used to increase the performance of a bit line equalizer. Additionally, as the amplitude of an external power supply voltage is reduced, the voltage between gate and source (Vgs) of the equalizer transistor may vary by more than the threshold voltage of an equalizer transistor drops. This makes it more difficult to have an acceptable transmission performance for data using only the external power supply voltage. So, a second boosting voltage less than Vpp but higher than the external power supply voltage may be used. This second boosting voltage is indicated as "Veq" in FIG. 1.

Hereinafter, a first voltage boosting circuit capable of generating the first boosting voltage Vpp, and a second voltage boosting circuit capable of generating the second boosting voltage Veq will be described in the context of an embodiment of the inventive concept.

Figure 1:
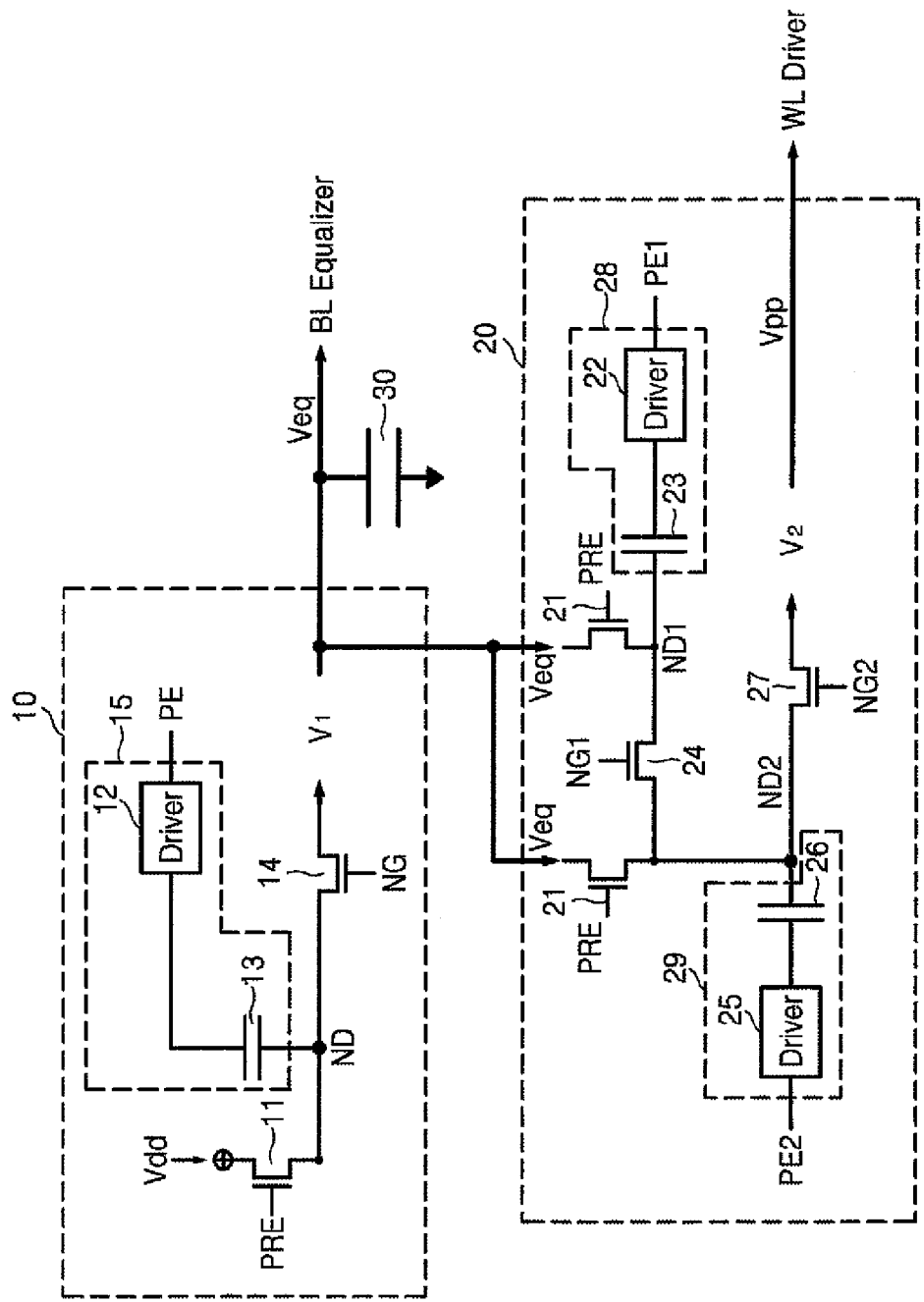
FIG. 1 is a schematic circuit diagram of a voltage boosting circuit according to an embodiment of the inventive concept.

FIG. 1 is a schematic circuit diagram of a voltage boosting circuit according to an embodiment of the inventive concept. The voltage boosting circuit comprises a first voltage boosting circuit 10 and a second voltage boosting circuit 20. The first voltage boosting circuit 10 boosts an external power supply voltage Vdd to generate the second boosting voltage Veq. The second boosting voltage Veq may then be applied to a bit line BL equalizer. In the illustrated example of FIG. 1, the external supply voltage Vdd is supplied through a pre-charge circuit 11. The pre-charge circuit 11 comprises a NMOS transistor receiving the external power supply voltage Vdd and controlled by a precharge control signal PRE.

Pre-charge circuit 11 thus charges a precharge voltage node ND of the first voltage boosting circuit 10 with the external power supply voltage Vdd. In some additional detail, when the precharge control signal (PRE) is applied to the gate of the NMOS transistor forming the pre-charge circuit 11 at a "high" level, the voltage apparent at precharge voltage node ND rises to the level of the external power supply voltage Vdd.

According to another embodiment, the pre-charge circuit 11 may be implemented using a P-channel Metal Oxide Semiconductor PMOS transistor. In this case, when the pre-charge control signal PRE is applied to the gate of the pre-charge circuit 11 at a "low" level, the voltage apparent at the precharge voltage node ND rises to the external power supply voltage Vdd.

The first voltage boosting circuit 10 illustrated in FIG. 1 further comprises a pumping circuit 15 pumping the voltage apparent at the precharge voltage node ND up to the second boosting voltage Veq in response to a pumping enable signal PE. The pumping circuit 15 comprises a driver 12 providing a predetermined voltage in response to the pumping enable signal PE and a capacitor for pumping the voltage apparent at the precharge voltage node ND to the second boosting voltage Veq, as charged by the voltage output from the driver 12.

The voltage boosting circuit illustrated in FIG. 1 according to an embodiment of the inventive concept further comprises a capacitor 30 sustaining the second boosting voltage Veq provided by the first voltage boosting circuit 10.

Within the second voltage boosting circuit 20, a first voltage node ND1 and a second voltage node ND2 are pre-charged to the level of the second boosting voltage Veq, as provided by the first voltage boosting circuit 10. The second voltage boosting circuit 20 then boosts the received second boosting voltage Veq to the first boosting voltage Vpp.

In some additional detail, the second voltage boosting circuit 20 comprises at least one pre-charge circuit 21 receiving the second boosting voltage Veq, as sustained by the capacitor 30. In the illustrated example of FIG. 1, the pre-charge circuit 21 comprises an NMOS transistor receiving the second boosting voltage Veq at its source.

The second voltage boosting circuit 20 boosts the received second boosting voltage Veq to generate the first boosting voltage Vpp using only a two-stage voltage boosting operation. The first boosting voltage Vpp may nonetheless be effectively provided to a word line WL driver (not shown). In the illustrated example, this is accomplished by the operation of the second voltage boosting circuit 20 comprising a first pumping circuit 28 and a second pumping circuit 29. The first pumping circuit 28 and second pumping circuit 29 operate until an output terminal voltage V2 provided by the second voltage boosting circuit 20 reaches the defined level of the first boosting voltage Vpp. The first pumping circuit 28 comprises a first driver 22 and a first capacitor 23, and the second pumping circuit 29 comprises a second driver 25 and a second capacitor 26.

Figure 2A:
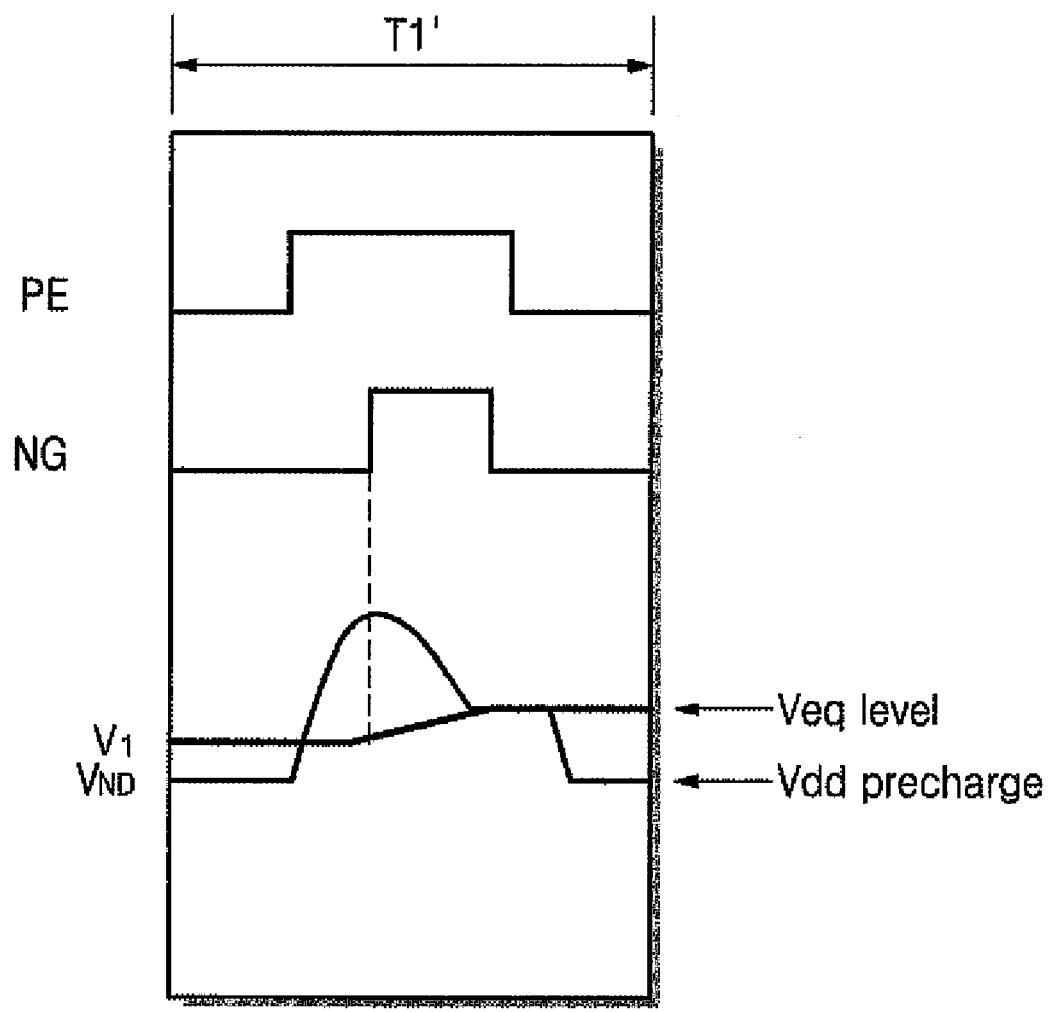
FIG. 2A is a timing diagram for a first voltage boosting circuit according to an embodiment of the inventive concept.

The operation of the first voltage boosting circuit 10 of FIG. 1 may be better understood by consideration of the timing diagram shown in FIG. 2A. Referring to FIGS. 1 and 2A, the precharge voltage node ND of a first voltage boosting circuit 10 is pre-charged to an external power supply voltage Vdd, and the first voltage boosting circuit 10 boosts the pre-charged external power supply voltage Vdd up to the second boosting voltage Veq. As illustrated in FIG. 2A, the voltage apparent at the precharge voltage node ND is pre-charged to the external power supply voltage Vdd and then pumped to the second boosting voltage Veq by the operation of the pumping circuit 15. The second boosting voltage Veq may then be provided as a first output voltage V1 at the output terminal of the first voltage boosting circuit 10 by the operation of a switching circuit 14.

That is, when a pumping enable signal PE is low, the driver 12 is not enabled and the voltage at the precharge voltage node ND may be pre-charged by the external power supply voltage Vdd provided through the pre-charge circuit 11. Here, the first output voltage V1 provided by the first voltage boosting circuit 10 is kept at a predetermined intermediate voltage level lower than that of the second boosting voltage Veq. The intermediate voltage level may be different than the external power supply voltage Vdd, or it may be the same.

When the pumping enable signal PE transitions from low to high, the driver 12 is enabled. Accordingly, the boosting capacitor 13 is charged with a voltage provided by the driver 12 and the voltage apparent at the precharge voltage node ND rises. Here, the voltage apparent at the precharge voltage node ND may increase according to a time constant $\tau=RC$, which is determined by the capacitance of the boosting capacitor 13 and effective resistance. The time constant "$\tau$" may be varied according to design requirements for certain embodiments of the inventive concept. According to some embodiments, the voltage apparent at the precharge voltage node ND may increase linearly.

While a low switching control signal NG is applied to the gate of the switching circuit, the switching circuit 14 is turned OFF, and the voltage apparent at the precharge voltage node ND increases with operation of the pumping circuit 15. However, when a high switching control signal NG is applied to the gate of the switching circuit 14, the switching circuit 14 is turned ON, and the voltage apparent at the precharge voltage node ND is output at the output terminal of the first voltage boosting circuit 10. Thus, the first output voltage V1 generated by the first voltage boosting circuit 10 may be increased as the switching signal NG applied to the switching circuit 14 controls until the first output voltage V1 reaches the second boosting voltage Veq.

When a first output voltage V1 of the first voltage boosting circuit 10 is boosted to the second boosting voltage Veq, the switching signal NG applied to the switching circuit 14 again transitions back to low and the switching circuit 14 is turned OFF. In this manner, the first output voltage V1 provided by the first voltage boosting circuit 10 may keep at the level of the second boosting voltage Veq. Additionally, the first output voltage V1 provided as the second boosting voltage Veq may be sustained by capacitor 30 connected to the output terminal. This sustained second boosting voltage Veq may then be used as a pre-charge voltage applied to the second voltage boosting circuit 20.

As illustrated in FIG. 2A, the first voltage boosting circuit 10 boosts the external power supply voltage Vdd to the second boosting voltage Veq using a single stage pumping operation performed over a first pumping time period T1'.

Figure 2B:
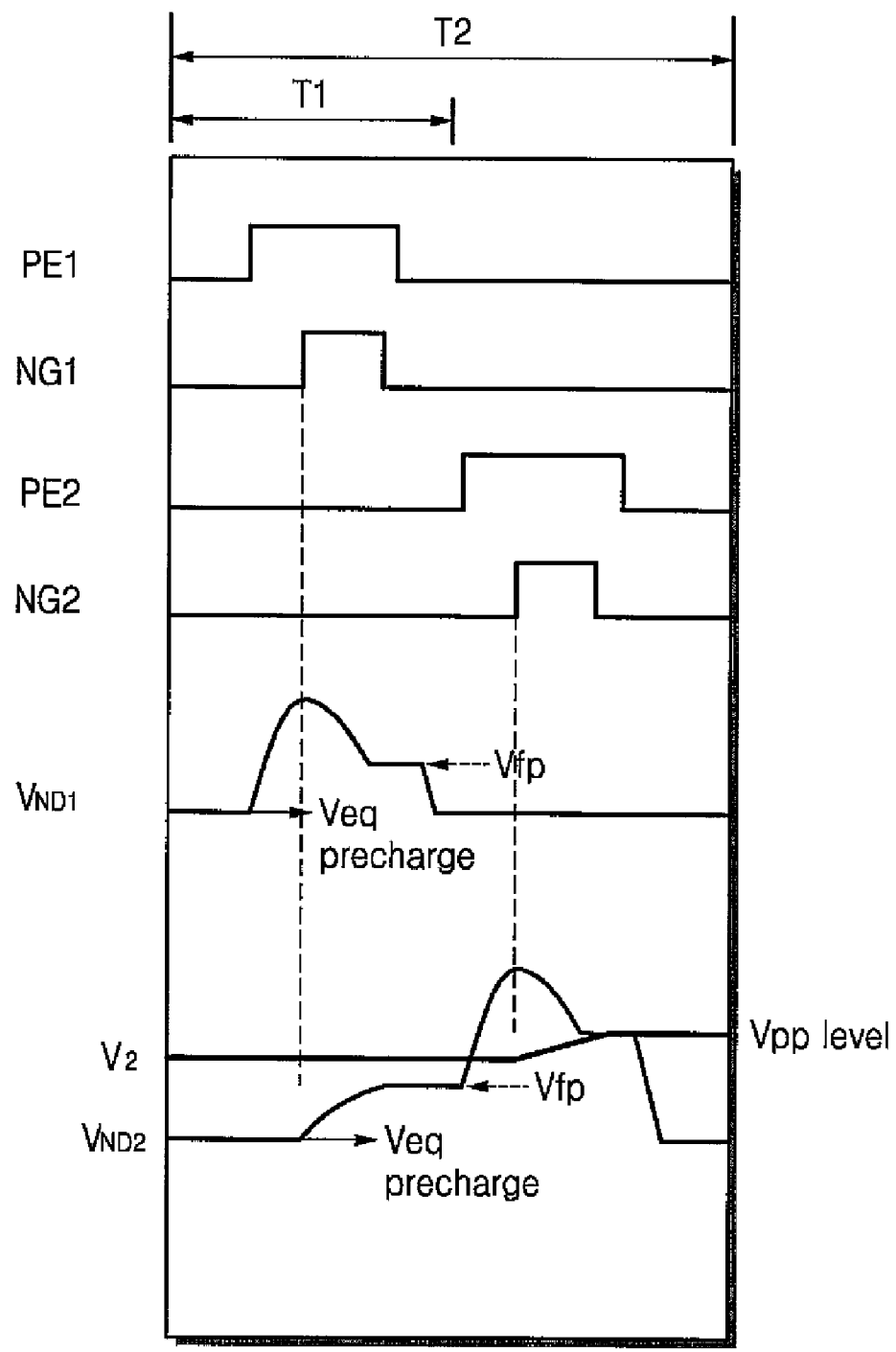
FIG. 2B is a timing diagram for a second voltage boosting circuit according to an embodiment of the inventive concept.

FIG. 2B is a timing diagram further describing the operation of the second voltage boosting circuit 20 according to an embodiment of the inventive concept. Referring to FIGS. 1 and 2B, the second voltage boosting circuit 20 comprises the first pumping circuit 28 and second pumping circuit 29. The first pumping circuit 28 pumps the voltage apparent at a first voltage node ND (i.e., the second boosting voltage Veq provided as a second precharge voltage) to an intermediate voltage Vfp between the second boosting voltage Veq and the first boosting voltage Vpp.

Referring to FIGS. 1 and 2B, a pumping operation of the first pumping circuit 28 will be explained in some additional detail. As illustrated in FIG. 2B, when the first pumping circuit 28 does not perform a pumping operation, the voltage at the first node ND1 of the second voltage boosting circuit 20 is pre-charged to the second boosting voltage Veq. As described above, while a pre-charge signal PRE of a pre-charge circuit 21 is kept high, the pre-charge circuit 21 is turned ON and the voltage at the first node ND1 is pre-charged to the second boosting voltage Veq.

When a first pumping enable signal PE1 transitions to low, the first driver 22 is enabled and the first capacitor 23 charged by predetermined voltage output from the first driver 22. Here, as described above, the first capacitor 23 may be charged according to a defined time constant τ, and the voltage at the first node ND1 increases until the first switching circuit 24 is turned ON.

Next, when a switching signal NG1 of a first switching circuit 24 transitions to low, the first switching circuit 24 is turned ON, the voltage charging the first capacitor 23 is discharged, and the voltage at the first node ND1 decreases as the voltage at the second node ND2 increases. By adjusting the time at which the switching signal NG1 applied to the first switching circuit 24 goes high, the voltage charging the first capacitor 23 may be adjusted according to the voltage delivered to a second node ND2. Thus, the level of the intermediate voltage Vfp may be adjusted. However, in the illustrated example, the intermediate voltage Vfp is higher than the second boosting voltage Veq and lower than the first boosting voltage Vpp. As illustrated in FIG. 2B, a first time period T1 is required to perform the first pumping operation of the second voltage boosting circuit 20.

The voltage at the second node ND2 is first pumped to the intermediate voltage Vfp by the first pumping circuit 28 and then again pumped to the first boosting voltage Vpp by the second pumping circuit 29. In some additional detail, the second pumping enable signal PE2 transitions from low to high and the second capacitor 26 is charged by the voltage output from the second driver 25. Here, the second capacitor 26 may be charged according to a defined time constant τ as described above, and a voltage at the second node ND2 is increased until the second switching circuit 27 is turned ON.

Next, when a switching signal NG2 of a second switching signal 27 transitions from low to high, the second switching circuit 27 is turned ON, the voltage charging the second capacitor 26 is discharged, and the second output voltage V2 provided at the output terminal of the second voltage boosting circuit 20 increases as soon as a voltage at the second node ND2 decreases. By adjusting the timing of the switching signal NG2 applied to the second switching circuit 27, the second output voltage V2 may be boosted to the first boosting voltage Vpp. As described above, the first boosting voltage Vpp provided by the second voltage boosting circuit 20 may be applied to a word line WL driver (not shown).

As illustrated in FIG. 2B, a second time period T2 is required for the voltage boosting circuit illustrated in FIG. 1 to provide the first boosting voltage Vpp. However, the total boosting time required for two-stage operation of the voltage circuit is significantly less than three-stage or higher voltage boosting circuits conventionally used.

Figure 3:
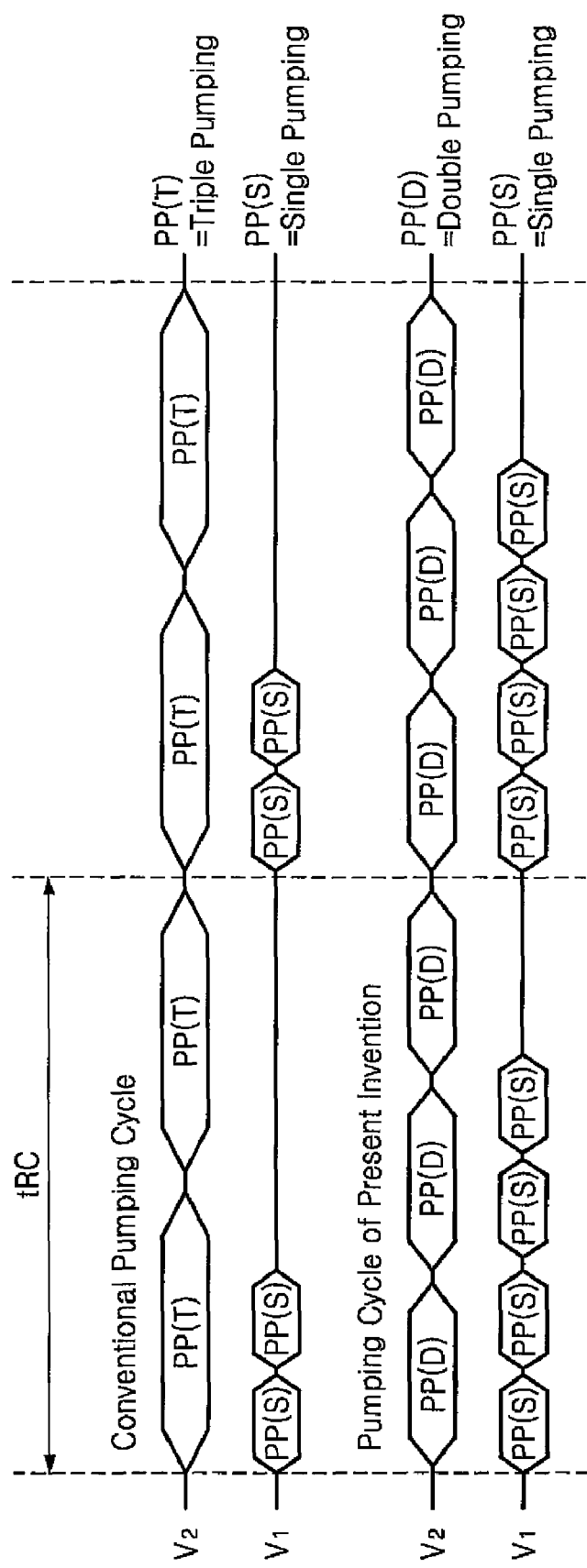
FIG. 3 comparatively illustrates the operational timing of a conventional voltage boosting circuit and a voltage boosting circuit according to an embodiment of the inventive concept.

FIG. 3 is a comparative diagram showing the timing operation of a conventional voltage boosting circuit and a voltage boosting circuit according to an embodiment of the inventive concept. The second boosting voltage Veq and first boosting voltage Vpp may be dependent on a word line WL activation cycle. For example, a word line activation cycle may be defined as tRC for a first memory array bank within a DRAM, and tRC may be closely related to properties of the second boosting voltage Veq and/or the first boosting voltage Vpp.

As illustrated in FIG. 3, as a cycle time generating a second voltage Vpp gets shorter, a Vpp voltage boosting operation is previously performed twice during time of the tRC; however, a Vpp voltage boosting operation may be performed three times during the time of the tRC according to a voltage boosting circuit of the present inventive concept. Therefore, a voltage boosting circuit according to an embodiment of the inventive concept may have a reduced size over comparable conventional circuits. Further, pumping ripple may be reduced. Accordingly, circuit size may be reduced and necessary voltage boosting voltages may be supplied to circuits in a more stable manner.

Figure 4:
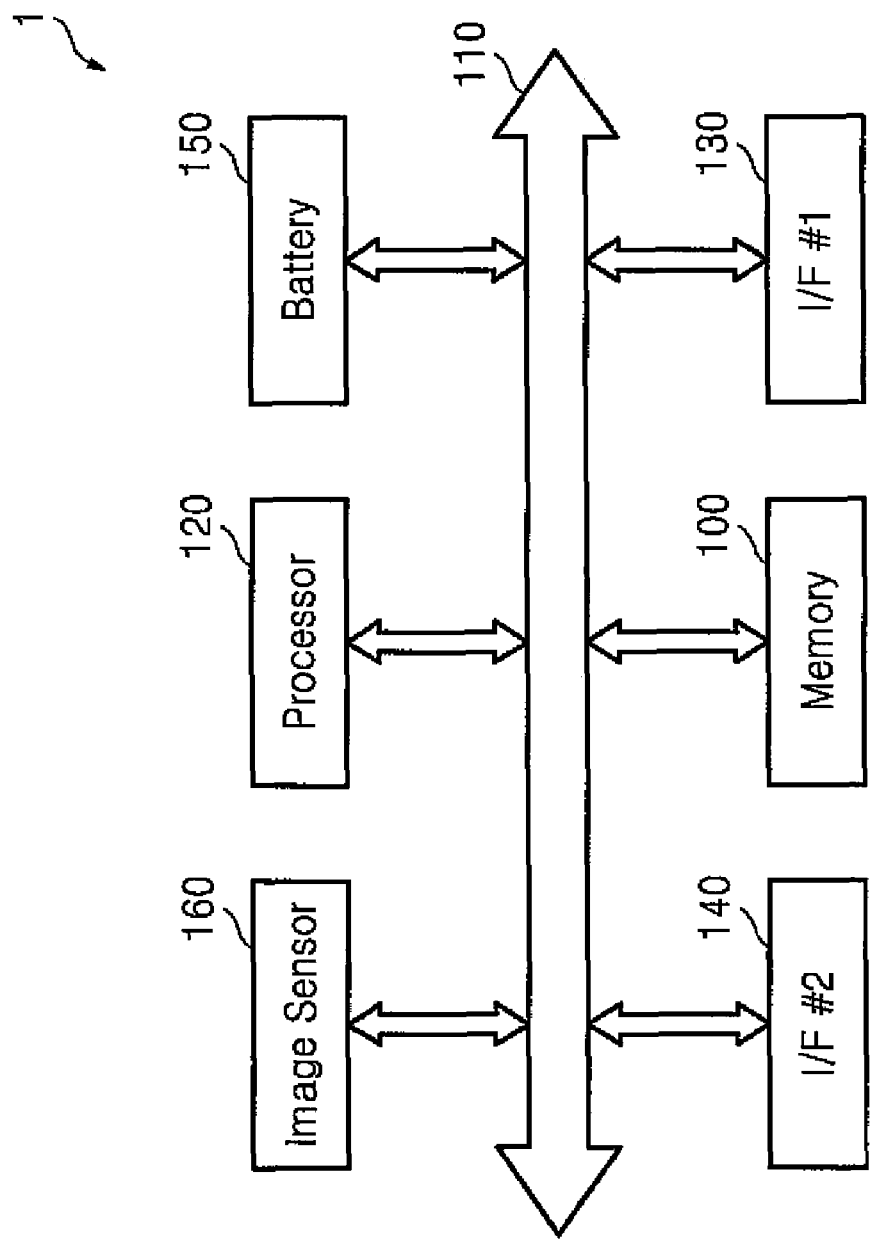
FIG. 4 is a general block diagram of a memory system incorporating a memory device including a voltage boosting circuit according to an embodiment of the inventive concept.

FIG. 4 is a general block diagram of a system incorporating a memory device 100 including a voltage boosting circuit according to an embodiment of the inventive concept. Referring to FIG. 4, the system 1 comprises a memory device 100 and a processor 120 connected via a system bus 110.

A processor 120 may generate control signals to control a program operation (or a write operation), a read operation or a verify read operation of the memory device 100. Accordingly, a control block (not shown) of the memory device 100 may perform a program operation (or a write operation), a read operation or a verify read operation in response to a control signal output from the processor 120.

According to some embodiments, when the memory system 1 of the present inventive concept is embodied as a portable application, the memory system 1 of the present inventive concept may further include a battery 150 for supplying an operation power to a memory device 100 and a processor 120. The portable application may include a portable computer, a digital still camera, a personal digital assistances (PDAs), a cellular telephone, an MP3 player, a Portable multimedia players (PMPs), an automotive navigation system, a memory card, a system card, a game apparatus, an electronic dictionary, and a solid state disk (SSD).

The memory system 1 may further include an interface, e.g., an input/output device 130, which is capable of exchanging data with an external data processing device. When the memory system 1 is a wireless system, the memory system 1 may further include a wireless interface 140. In this case, the wireless interface 140 may be connected to a processor 120, and receive or send data with an external wireless device by radio through a system bus 110.

The wireless system can be a wireless device such as a PDA, a portable computer, a wireless telephone, a pager, a digital camera, a RFID reader, or a RFID system. In addition, the wireless system may be a Wireless Local Area Network WLAN system or a Wireless Personal Area Network WPAN system. The wireless system may be a cellular network.

When the memory system 1 of the present inventive concept is an image pick-up device, the memory system 1 may further include an image sensor 160 capable of converting an optical signal to an electrical signal. The image sensor 160 may be an image sensor using charge-coupled device (CCD) or a complementary metal-oxide semiconductor (CMOS) image sensor. In this case, the memory system 1 may be a digital camera or a cellular phone where a digital camera is embedded. Moreover, the memory system 1 of the present inventive concept may be a satellite system where a camera is embedded.

The voltage boosting circuit according to an embodiment of the inventive concept may reduce a pumping cycle dramatically and promote a miniaturization of circuit size by decreasing a size of a capacitor considerably.

Although a few embodiments of the present inventive concept have been shown and described, it will be appreciated by those skilled in the art that changes may be made in these embodiments without departing from the scope of the inventive concept as defined by the appended claims and their equivalents.

What is claimed is:

1. A voltage boosting circuit consisting of:
   a first voltage boosting circuit configured to receive an external power supply voltage, and pump the external power supply voltage to a second boosting voltage higher than the external supply voltage in a single pumping stage, wherein the first voltage boosting circuit comprises:
      a pre-charge circuit configured to charge a precharge voltage node with the external power supply voltage in response to a pre-charge signal;
      a pumping circuit configured to pump a voltage apparent at the precharge voltage node to the second boosting voltage in response to a pumping enable signal; and
      a switching circuit configured to provide the second boosting voltage in response to a switching signal; and
   a second voltage boosting circuit configured to receive the second boosting voltage and pump the second boosting voltage to a first boosting voltage higher than the second boosting voltage in two pumping stages.

2. The voltage boosting circuit of claim 1, further comprising; a capacitor sustaining the second boosting voltage at a defined level as the second boosting voltage is applied to the second voltage boosting circuit as a precharge voltage.

3. The voltage boosting circuit of claim 1, wherein the pumping circuit comprises:
   a driver configured to provide a voltage in response to the pumping enable signal; and
   a capacitor being charged by the voltage provided by the driver and configured to pump the voltage apparent at the precharge voltage node to the second boosting voltage.

4. A voltage boosting circuit consisting of:
   a first voltage boosting circuit configured to receive an external power supply voltage, and pump the external power supply voltage to a second boosting voltage higher than the external supply voltage in a single pumping stage; and
   a second voltage boosting circuit configured to receive the second boosting voltage and pump the second boosting voltage to a first boosting voltage higher than the second boosting voltage in two pumping stages, wherein the second voltage boosting circuit comprises:
      a pre-charge circuit configured to charge voltages apparent at a first node and a second node to the second boosting voltage in response to a pre-charge signal;
      a first pumping circuit configured to pump the voltage apparent at the first node to an intermediate voltage higher than the second boosting voltage and lower than the first boosting voltage in response to a first pumping enable signal;
      a first switching circuit configured to connect the first node and the second node in response to a first switching signal;
      a second pumping circuit configured to pump the voltage apparent at the second node to the first boosting voltage in response to a second pumping enable signal; and
      a second switching circuit configured to output the first boosting voltage in response to a second switching signal.

5. A semiconductor device comprising:
   a voltage boosting circuit consisting of:
      a first voltage boosting circuit configured to receive an external power supply voltage, and pump the external power supply voltage to a second boosting voltage higher than the external supply voltage in a single pumping stage, wherein the first voltage boosting circuit comprises:
         a pre-charge circuit configured to charge a precharge voltage node with the external power supply voltage in response to a pre-charge signal;
         a pumping circuit configured to pump a voltage apparent at the precharge voltage node to the second boosting voltage in response to a pumping enable signal; and
         a switching circuit configured to provide the second boosting voltage in response to a switching signal; and
      a second voltage boosting circuit configured to receive the second boosting voltage and pump the second boosting voltage to a first boosting voltage higher than the second boosting voltage in two pumping stages.

6. The semiconductor device of claim 5, wherein the voltage boosting circuit further comprises; a capacitor sustaining the second boosting voltage at a defined level as the second boosting voltage is applied to the second voltage boosting circuit as a precharge voltage.

7. The semiconductor device of claim 6, wherein the pumping circuit comprises:
   a driver configured to provide a voltage in response to the pumping enable signal; and
   a capacitor being charged by the voltage provided by the driver and configured to pump the voltage apparent at the precharge voltage node to the second boosting voltage.

8. The semiconductor device of claim 6, wherein the second voltage boosting circuit comprises:

a pre-charge circuit configured to charge voltages apparent at a first node and a second node to the second boosting voltage in response to a pre-charge signal;

a first pumping circuit configured to pump the voltage apparent at the first node to an intermediate voltage higher than the second boosting voltage and lower than the first boosting voltage in response to a first pumping enable signal;

a first switching circuit configured to connect the first node and the second node in response to a first switching signal;

a second pumping circuit configured to pump the voltage apparent at the second node to the first boosting voltage in response to a second pumping enable signal; and a second switching circuit configured to output the first boosting voltage in response to a second switching signal.

* * * * *